United States Patent
Bertz et al.

(10) Patent No.: US 9,104,611 B1
(45) Date of Patent: Aug. 11, 2015

(54) MANAGEMENT OF SYNTAX ERRORS IN SIGNALING MESSAGES

(71) Applicant: Sprint Communications Company L.P., Overland Park, KS (US)

(72) Inventors: Lyle T. Bertz, Lee's Summit, MO (US); Daniel Joe Sershen, Overland Park, KS (US); James Walter Norris, Kansas City, MO (US)

(73) Assignee: Sprint Communications Company L.P., Overland Park, KS (US)

( * ) Notice: Subject to any disclaimer, the term of this patent is extended or adjusted under 35 U.S.C. 154(b) by 356 days.

(21) Appl. No.: 13/675,564

(22) Filed: Nov. 13, 2012

(51) Int. Cl.
- *H04L 1/00* (2006.01)
- *G06F 11/14* (2006.01)
- *H04L 29/12* (2006.01)
- *G11B 20/18* (2006.01)
- *H03M 13/00* (2006.01)

(52) U.S. Cl.
CPC ............ *G06F 11/1412* (2013.01); *G11B 20/18* (2013.01); *H04L 1/0057* (2013.01); *H04L 1/0061* (2013.01); *H04L 61/308* (2013.01); *H03M 13/00* (2013.01)

(58) Field of Classification Search
CPC ... H04L 1/0045; H04L 1/0057; H04L 1/0061; H04L 61/3085; H04L 61/308; H04L 61/309; H03M 13/00
USPC .......................................... 714/746, 747, 764
See application file for complete search history.

(56) References Cited

U.S. PATENT DOCUMENTS

| | | | | |
|---|---|---|---|---|
| 6,094,665 | A * | 7/2000 | Lyons et al. .................. | 715/234 |
| 7,131,048 | B2 * | 10/2006 | Suzuki et al. ................. | 714/748 |
| 7,653,735 | B2 | 1/2010 | Mandato et al. | |
| 2007/0079168 | A1 * | 4/2007 | Sivakumar et al. ............... | 714/1 |
| 2009/0258630 | A1 * | 10/2009 | Purohit ......................... | 455/406 |
| 2010/0172297 | A1 * | 7/2010 | Amerga et al. ............... | 370/328 |
| 2012/0201238 | A1 * | 8/2012 | Lawson et al. ................ | 370/352 |

\* cited by examiner

*Primary Examiner* — Albert Decady
*Assistant Examiner* — Osman Alshack (57) ABSTRACT

A signaling error management system handles a syntax error in a signaling message received by a wireless communication network from a wireless communication device. The signaling error management system comprises a processing system and a communication transceiver. The processing system is configured to process text of the signaling message to detect the syntax error, correlate the syntax error to an error code, and correlate the error code to a uniform resource identifier (URI). The communication transceiver is configured to transfer the error code and the URI for delivery to the wireless communication device, wherein the wireless communication device uses the URI to retrieve correction data for the syntax error.

17 Claims, 5 Drawing Sheets

MANAGEMENT OF SYNTAX ERRORS IN SIGNALING MESSAGES

TECHNICAL BACKGROUND

A wireless communication device transmits and receives information wirelessly via a wireless access node to communicate over a communication network. Typically, the wireless access node is part of a radio access network (RAN) which provides the wireless communication device with access to further communication networks, systems, and devices. Many different initialization and exchange protocols may be employed to facilitate the transmission of voice and data to and from a wireless communication device. For example, a wireless communication device communicating with a media server may use a session description protocol (SDP) format to describe streaming media initialization parameters, which is often used in conjunction with a real-time transport protocol (RTP), real-time streaming protocol (RTSP), session initiation protocol (SIP), and other application layer protocols. Various other protocols may be utilized at the physical layer, data link layer, network layer, transport layer, and other layers of the Open Systems Interconnection (OSI) model for communication systems.

Occasionally, complications may arise when a wireless communication device transmits information in a given protocol that contains a syntax error. Syntax errors during communications may occur for many reasons, including device misconfigurations, typographical errors, incompatible shorthand abbreviations, noncompliance with protocol standards, outdated information, such as labels used in signaling prior to standardization, and other textual anomalies. Unfortunately, such syntax errors can place additional demand on network resources and may require cumbersome workarounds in the network.

OVERVIEW

A method of operating a wireless communication network to handle a syntax error in a signaling message received from a wireless communication device is disclosed. The method comprises processing text of the signaling message to detect the syntax error. The method further comprises correlating the syntax error to an error code, and correlating the error code to a uniform resource identifier (URI). The method further comprises transferring the error code and the URI for delivery to the wireless communication device, wherein the wireless communication device uses the URI to retrieve correction data for the syntax error.

A signaling error management system to handle a syntax error in a signaling message received by a wireless communication network from a wireless communication device is disclosed. The signaling error management system comprises a processing system and a communication transceiver. The processing system is configured to process text of the signaling message to detect the syntax error, correlate the syntax error to an error code, and correlate the error code to a uniform resource identifier (URI). The communication transceiver is configured to transfer the error code and the URI for delivery to the wireless communication device, wherein the wireless communication device uses the URI to retrieve correction data for the syntax error.

A computer apparatus to handle a syntax error in a signaling message received by a wireless communication network from a wireless communication device is disclosed. The computer apparatus comprises software instructions and at least one non-transitory computer-readable storage medium storing the software instructions. The software instructions are configured, when executed by a computer system, to direct the computer system to process text of the signaling message to detect the syntax error. The software instructions are further configured to direct the computer system to correlate the syntax error to an error code and correlate the error code to a uniform resource identifier (URI). The software instructions are further configured to direct the computer system to transfer the error code and the URI for delivery to the wireless communication device, wherein the wireless communication device uses the URI to retrieve correction data for the syntax error.

DETAILED DESCRIPTION

The following description and associated drawings teach the best mode of the invention. For the purpose of teaching inventive principles, some conventional aspects of the best mode may be simplified or omitted. The following claims specify the scope of the invention. Some aspects of the best mode may not fall within the scope of the invention as specified by the claims. Thus, those skilled in the art will appreciate variations from the best mode that fall within the scope of the invention. Those skilled in the art will appreciate that the features described below can be combined in various ways to form multiple variations of the invention. As a result, the invention is not limited to the specific examples described below, but only by the claims and their equivalents.

Figure 1:
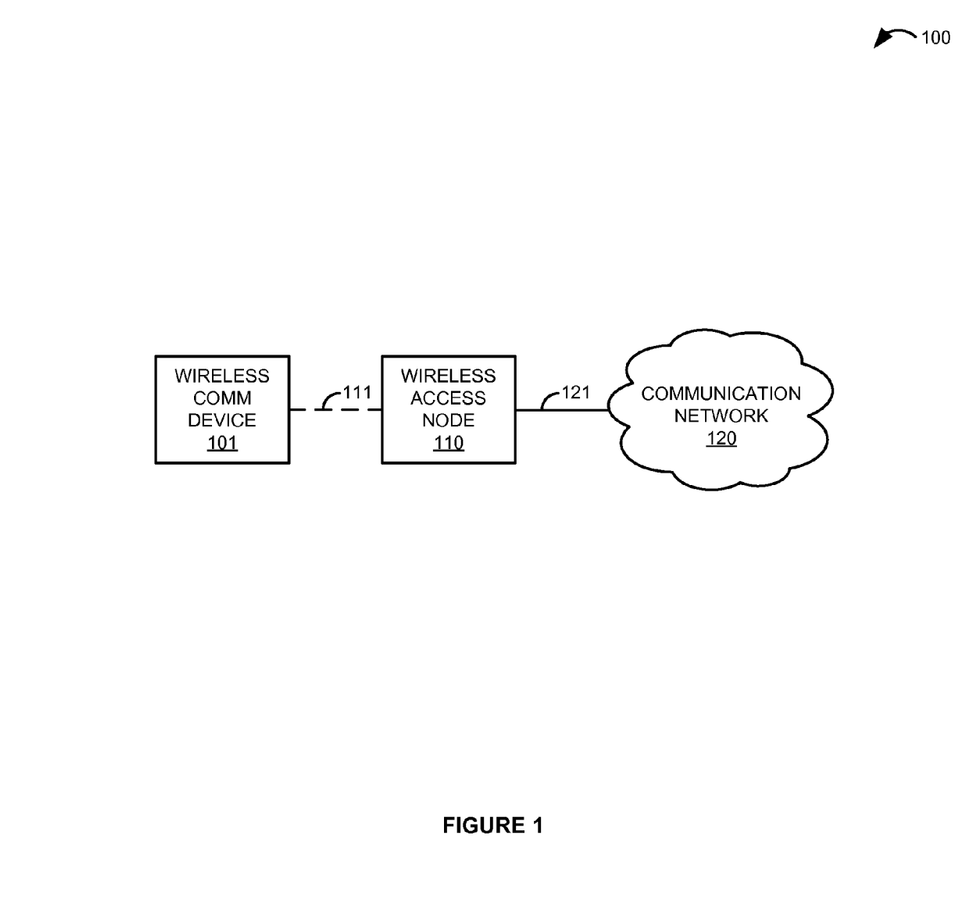
FIG. 1 is a block diagram that illustrates a communication system.

FIG. 1 is a block diagram that illustrates communication system 100. Communication system 100 includes wireless communication device 101, wireless access node 110, and communication network 120. Wireless communication device 101 and wireless access node 110 are in communication over wireless communication link 111. Wireless access node 110 and communication network 120 are in communication over communication link 121.

Figure 2:
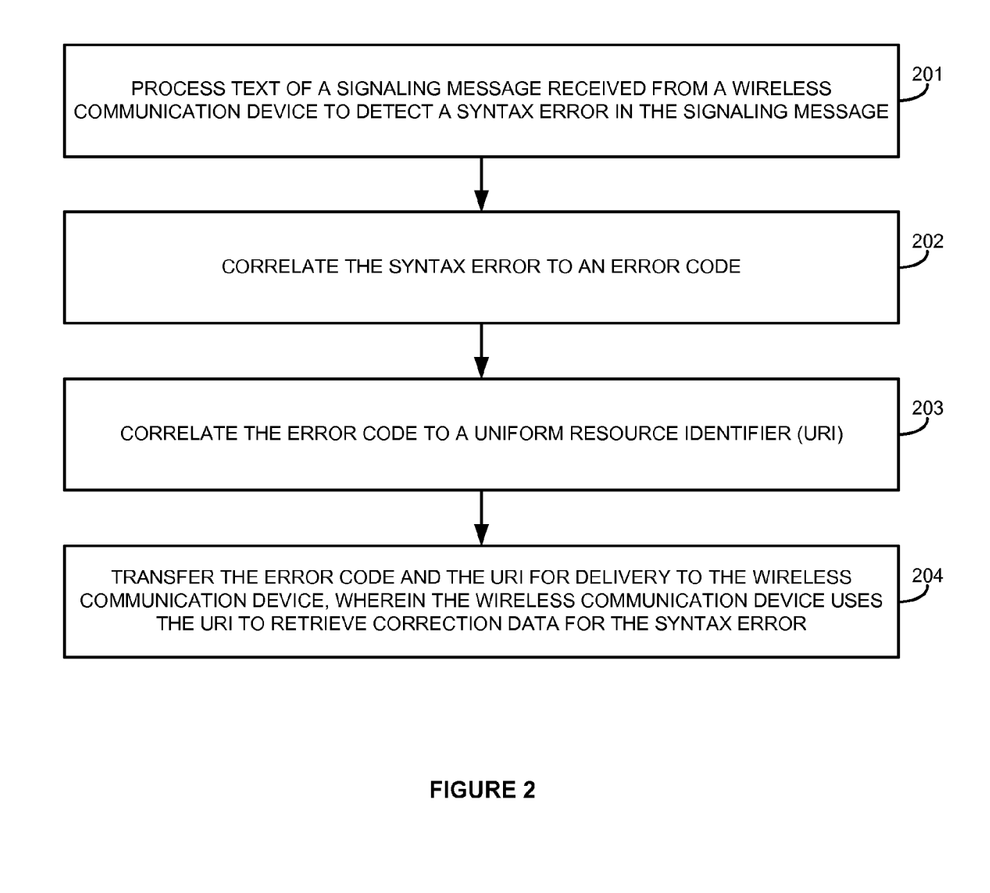
FIG. 2 is a flow diagram that illustrates an operation of the communication system.

FIG. 2 is a flow diagram that illustrates an operation of communication system 100. The steps of the operation are indicated below parenthetically. The operation of communication system 100 shown in FIG. 2 may be employed by a wireless communication network to handle a syntax error in a signaling message received from wireless communication device 101.

To begin, text of a signaling message received from wireless communication device 101 is processed to detect the syntax error (201). The signaling message could comprise any message in any protocol. In some examples, the signaling message could comprise a message received in a session description protocol (SDP), session initiation protocol (SIP), real time streaming protocol (RTSP), hyper text transfer protocol (HTTP), simple mail transfer protocol (SMTP), interactive connectivity establishment (ICE) format, internet control message protocol (ICMP), or any other communication protocol. When the signaling message is received from wireless communication device 101, the syntax error in the signaling message is detected by text. In some examples, the signaling message could include values or constants that contain typographical errors, incompatible shorthand abbreviations, outdated labels used in signaling prior to standardization, and many other syntax errors in the text of the signaling message. For example, the wireless communication network could expect to receive a value with the label "1xRTT" in an SDP signaling message received from wireless communication device 101, but instead a value labeled "1x", "RTT", or any other incorrect variation is received in the message and would be detected as a syntax error. In another example, a syntax error could be detected from an outdated term that was used prior to standardization, such as the use of the term "Wi-Fi" instead of "offload" because the first offload radio technology was Wi-Fi. These and any other syntax errors could be detected in the text of the signaling message received from wireless communication device 101 and are within the scope of this disclosure.

After detecting the syntax error in the signaling message, the syntax error is correlated to an error code (202). Typically, the error code is stored in a relational database along with the syntax error or errors that are associated with the error code, but the syntax error could be correlated to the error code in other ways. In examples that utilize such a database, the database could then be searched with the syntax error to identify the corresponding error code. In some examples, the syntax error could be correlated to the error code by correlating the syntax error to a type of previously logged errors. For example, a wireless communication network could log syntax errors and group the errors by type, and each type could be associated with an error code. The database mentioned above could then be referenced to determine the error code that correlates to the syntax error. Other techniques of correlating the syntax error to an error code are also possible.

The operation of FIG. 2 continues by correlating the error code to a uniform resource identifier (URI) (203). Typically, the error code is correlated to the URI using a relational database in a manner as described above for correlating the syntax error to the error code. The URI typically describes a resource that provides correction data associated with the syntax error. In some examples, the URI could be stored along with the error code for use in responding to the detected syntax error.

The error code and URI are transferred for delivery to wireless communication device 101 (204). Wireless communication device 101 then uses the URI to retrieve correction data for the syntax error (204). Typically, the correction data could comprise any data associated with the syntax error and/or error code that is transmitted to wireless communication device 101. For example, the correction data could comprise information for a user of wireless communication device 101, such as information that explains the error code, graphics/content for the user such as web pages, menus, check boxes, and the like, information on how to repair the syntax error or a link to download a firmware patch, and any other data associated with the error code. In some examples, the correction data could comprise program instructions that direct wireless communication device 101 to correct the syntax error, such as a software update or patch associated with the error code. For example, the correction data could comprise program instructions that direct wireless communication device 101 to update a protocol associated with the syntax error. In some examples, when the correction data comprises program instructions, the correction data could be automatically applied by wireless communication device 101 to correct the syntax error. Further, the number of occurrences of each of the various types of previously logged errors could be logged as described above, and the URI and/or the correction data could be generated after a threshold number of occurrences of the type of previously logged errors that correlates to the error code and/or syntax error in some examples.

Advantageously, a wireless communication network can utilize the above method to detect and respond to syntax errors in signaling messages received from wireless communication device 101. By correlating the syntax error to an error code and associated URI, the wireless communication network is able to transfer relevant correction data to wireless communication device 101 in response to the detected syntax error. In some examples, the correction data may provide useful information for the user of wireless communication device 101 pertaining to the syntax error, and may include program instructions for wireless communication device 101 to apply a software update that corrects the error. In this manner, the wireless communication network can quickly resolve the root of the detected syntax error, relieving the network from the burden of handling the syntax error in messages received from wireless communication device 101 in the future.

Referring back to FIG. 1, wireless communication device 101 comprises any device having wireless communication connectivity with hardware and circuitry programmed to function as a telecommunications device, such as Radio Frequency (RF) communication circuitry and an antenna. The RF communication circuitry typically includes an amplifier, filter, modulator, and signal processing circuitry. Wireless communication device 101 may also include a user interface, memory system, software, processing circuitry, or some other communication components. For example, wireless communication device 101 could comprise a telephone, transceiver, mobile phone, cellular phone, smartphone, computer, personal digital assistant (PDA), e-book, game console, mobile Internet device, wireless network interface card, media player, or some other wireless communication apparatus—including combinations thereof. Wireless network protocols that may be utilized by wireless communication device 101 include Code Division Multiple Access (CDMA) 1xRTT, Global System for Mobile communications (GSM), Universal Mobile Telecommunications System (UMTS), High-Speed Packet Access (HSPA), Evolution-Data Optimized (EV-DO), EV-DO rev. A, B, and C, Third Generation Partnership Project Long Term Evolution (3GPP LTE), LTE Advanced, Worldwide Interoperability for Microwave Access (WiMAX), IEEE 802.11 protocols (Wi-Fi), Bluetooth, Internet, telephony, or any other wireless network protocol that facilitates communication between wireless communication device 101 and wireless access node 110.

Wireless access node 110 comprises RF communication circuitry and an antenna. The RF communication circuitry typically includes an amplifier, filter, RF modulator, and signal processing circuitry. Wireless access node 110 may also comprise a router, server, memory device, software, processing circuitry, cabling, power supply, network communication interface, structural support, or some other communication apparatus. Wireless access node 110 could comprise a base station, Internet access node, telephony service node, wireless data access point, or some other wireless communication system—including combinations thereof. Some examples of wireless access node 110 include a base transceiver station (BTS), base station controller (BSC), radio base station (RBS), Node B, enhanced Node B (eNodeB), and others—including combinations thereof. Wireless network protocols that may be utilized by wireless access node 110 include CDMA, GSM, UMTS, HSPA, EV-DO, EV-DO rev. A, B, and C, 3GPP LTE, LTE Advanced, WiMAX, Wi-Fi, Bluetooth, Internet, telephony, or some other communication format—including combinations thereof.

Communication network 120 comprises the core network of a wireless communication service provider, and could include routers, gateways, telecommunication switches, servers, processing systems, or other communication equipment and systems for providing communication and data services. Communication network 120 could comprise wireless communication nodes, telephony switches, Internet routers, network gateways, computer systems, communication links, or some other type of communication equipment—including combinations thereof. Communication network 120 may also comprise optical networks, asynchronous transfer mode (ATM) networks, packet networks, radio access networks (RAN), local area networks (LAN), metropolitan area networks (MAN), wide area networks (WAN), or other network topologies, equipment, or systems—including combinations thereof. Communication network 120 may be configured to communicate over metallic, wireless, or optical links—including combinations thereof. Communication network 120 may be configured to use time-division multiplexing (TDM), Internet Protocol (IP), Ethernet, optical networking, wireless protocols, communication signaling, or some other communication format—including combinations thereof. In some examples, communication network 120 includes further access nodes and associated equipment for providing communication services to many wireless communication devices across a large geographic region.

Wireless communication link 111 uses the air or space as the transport medium. Wireless communication link 111 may use various protocols, such as CDMA, GSM, UMTS, HSPA, EV-DO, EV-DO rev. A, B, and C, 3GPP LTE, LTE Advanced, WiMAX, Wi-Fi, Bluetooth, Internet, telephony, or some other communication format—including combinations thereof. Wireless communication link 111 may comprise many different signals sharing the same link. For example, wireless communication link 111 could include multiple signals operating in a single propagation path comprising multiple communication sessions, frequencies, timeslots, transportation ports, logical transportation links, network sockets, IP sockets, packets, or communication directions—including combinations thereof.

Communication link 121 uses metal, air, space, optical fiber such as glass or plastic, or some other material as the transport medium—including combinations thereof. Communication link 121 could use various communication protocols, such as TDM, IP, Ethernet, telephony, optical networking, hybrid fiber coax (HFC), communication signaling, wireless protocols, or some other communication format—including combinations thereof. Communication link 121 may be a direct link or could include intermediate networks, systems, or devices.

Figure 3:
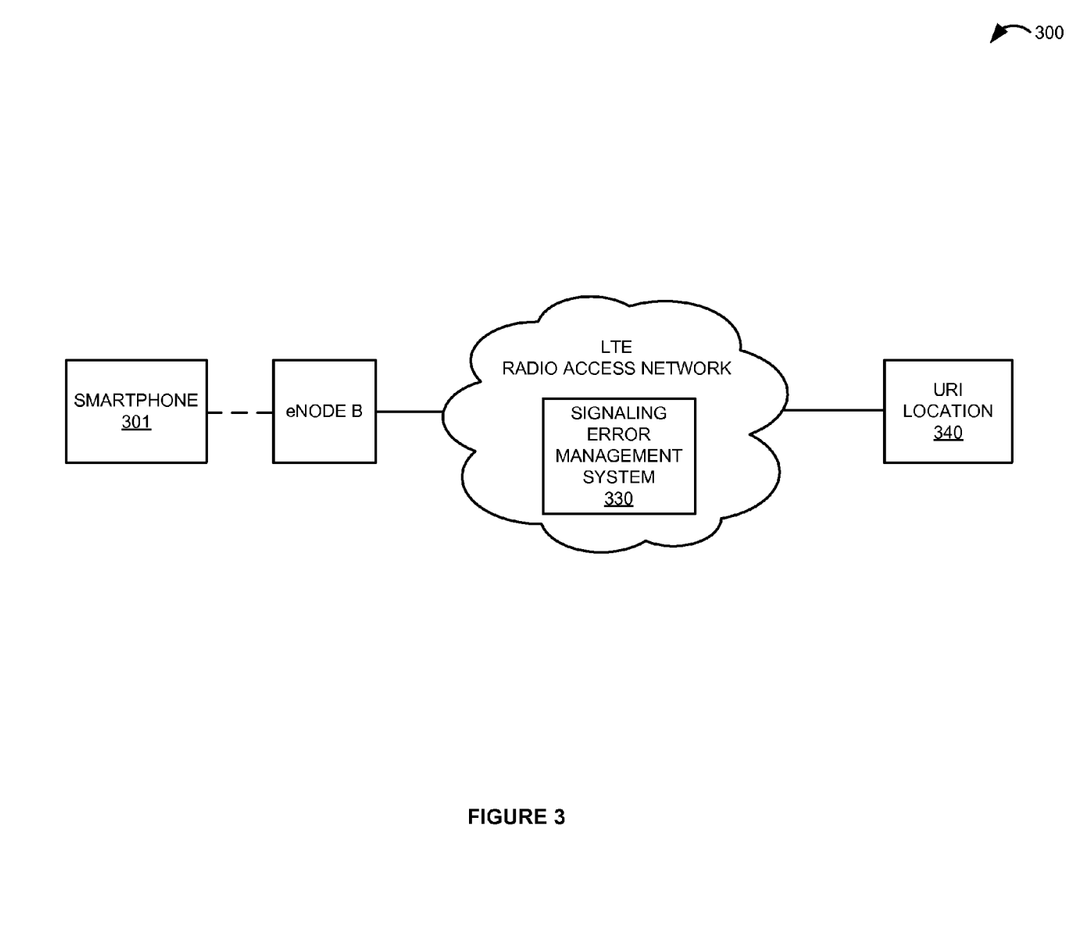
FIG. 3 is a block diagram that illustrates a communication system in an exemplary embodiment.

FIG. 3 is a block diagram that illustrates communication system 300 in an exemplary embodiment. Communication system 300 provides an example of a 4G LTE wireless communication system. Communication system 300 includes smartphone 301 which is in communication with the LTE RAN via an eNodeB. The LTE RAN and URI location 340 are shown as being in communication over a communication link, although the URI location could be within the LTE RAN in some examples. As shown in FIG. 3, included within the LTE RAN is signaling error management system 330.

Signaling error management system 330 comprises a processing system and communication transceiver. Signaling error management system 330 may also include other components such as a router, server, data storage system, and power supply. Signaling error management system 330 may reside in a single device or may be distributed across multiple devices. Signaling error management system 330 may be a discrete system or may be integrated within other systems—including other systems within communication system 300. In some examples, signaling error management system 330 could comprise a home agent, packet data serving node (PDSN), network switch, mobile switching center, router, switching system, packet gateway, network gateway system, Internet access node, application server, service node, firewall, or some other communication system—including combinations thereof.

Figure 4:
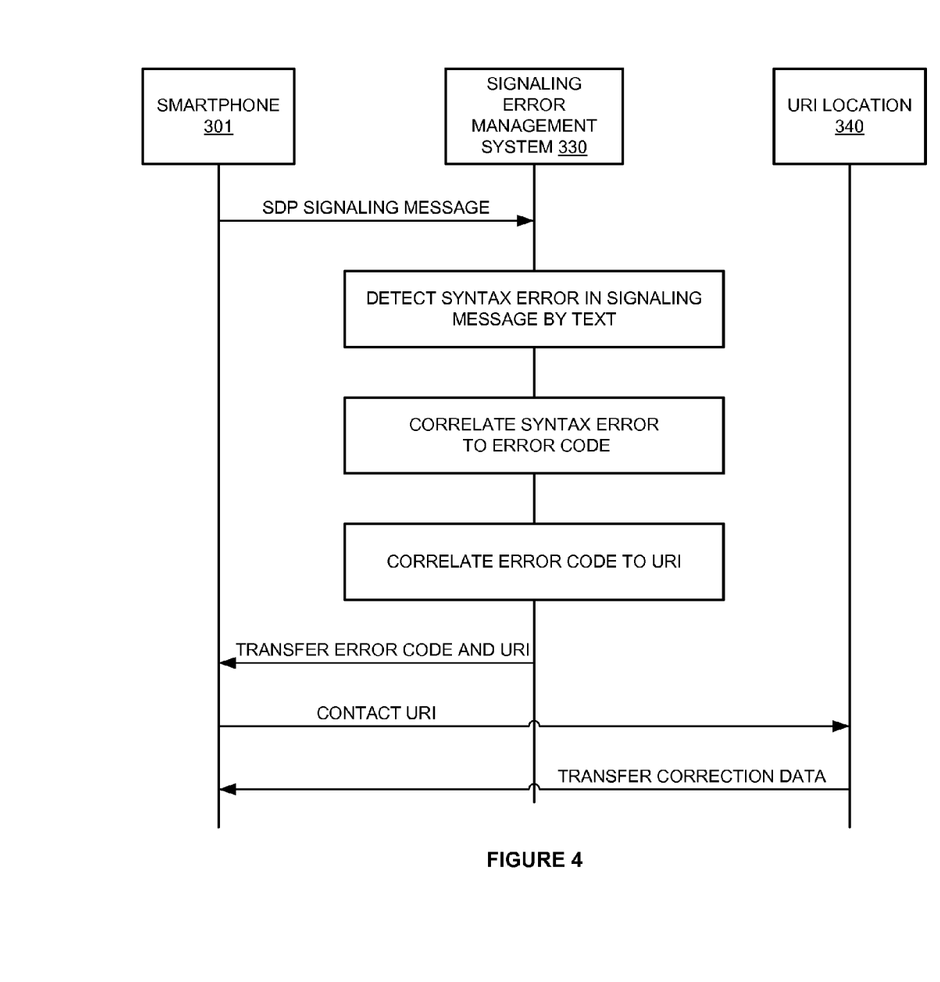
FIG. 4 is a sequence diagram that illustrates an operation of a communication system in an exemplary embodiment.

FIG. 4 is a sequence diagram that illustrates an operation of communication system 300 in an exemplary embodiment. Initially, smartphone 301 transfers a signaling message described in an SDP format over the LTE RAN. In this example, the signaling message includes a value to designate an LTE connection that the RAN expects will be labeled "LTE". However, smartphone 301 has been hardcoded with an incorrect label of "LT" instead of "LTE" for this value due to a typographical error in a recent firmware update applied to smartphone 301 by the manufacturer. This error in the signaling message is detected by network elements in the RAN which are configured to transfer the signaling message containing the syntax error to the signaling error management system 330.

Signaling error management system 330 receives the signaling message and detects the "LT" syntax error in the signaling message by text. Signaling error management system 330 then correlates the syntax error to an error code. In this example, signaling error management system 330 has detected this particular syntax error several times in the past and has previously created an error code to describe this type of syntax error. For example, signaling error management system 330 may have logged the error each time it was detected in the past and kept a running count of the number of times the error had been logged, and created the error code associated with the syntax error after a threshold number of signaling messages were received that included this syntax error. By utilizing these error logs and their associated error code, signaling error management system 330 is thus able to correlate the syntax error to the error code.

Signaling error management system 330 may also store additional information along with the error code for the syntax error, such as a device type or types that have sent messages that include this error, locations/regions where these devices were located, network elements to which the message was directed, and other information associated with the syntax error as determined by signaling error management system 330. In some examples, signaling error management system 330 may compare the device type, location, and other information associated with smartphone 301 to comparable historical information associated with the error code for the syntax error in order to correlate the syntax error to the error code and to verify that the error code is correct for the syntax error detected in the signaling message transmitted from smartphone 301. Likewise, signaling error management system 330 may compare the intended recipient of the signaling message to intended recipients of signaling messages with the same syntax error that were previously logged for the error code to facilitate in correlating the syntax error to the error code.

After determining the error code for the detected syntax error, signaling error management system 330 correlates the error code to a URI. The URI describes a location where smartphone 301 may contact a network resource and acquire correction data for the syntax error. For example, network personnel within the LTE RAN may have developed a firmware update for smartphone 301 to fix the syntax error associated with the error code, which in this example would change the incorrect hardcoded term of "LT" stored in smartphone 301 to the correct label of "LTE". This software update is included in the correction data for the syntax error exhibited by smartphone 301, and the location where smartphone 301 could download this correction data is described by the URI which is correlated to the error code. For example, the URI could be associated with the error code in a relational database, or simply stored along with the error code and discovered upon correlating the syntax error to the error code. In this example, the correction data is available at URI location 340, so the URI provides a link to this location.

Instead of simply transferring a failure notification, signaling error management system 330 transfers both the error code and the URI associated with the syntax error for delivery to smartphone 301. In this example, upon receipt of the error notification and the URI, smartphone 301 is configured to automatically contact the URI. However, in some examples, the error code and URI received by smartphone 301 could include program instructions that direct smartphone 301 to connect to the URI. In another example, smartphone 301 could inform its user that an error has occurred and prompt the user for permission to access the URI received from signaling error management system 330. In any event, smartphone 301 contacts the URI and receives correction data for the syntax error from URI location 340.

In some examples, prior to transferring the error code and URI to smartphone 301, signaling error management system 330 could correlate the syntax error and/or its associated error code to other error codes that may also be associated with the error. For example, signaling error management system 330 may determine that several additional syntax errors are commonly associated with the "LT" syntax error exhibited by smartphone 301, and could correlate these additional syntax errors to the "LT" syntax error. Signaling error management system 330 could then transfer several URIs that provide correction data for all of the associated error codes. Alternatively, the correction data available at the URI provided by signaling error management system 330 could include program instructions that direct smartphone 301 to update its firmware to correct all of the associated syntax errors that have been previously correlated by signaling error management system 330.

The correction data in this example includes program instructions that direct smartphone 301 to update its internal firmware to correct the syntax error so that future signaling messages generated by smartphone 301 will no longer contain this error. Thus, smartphone 301 processes the correction data and updates the label "LT" to the correct value of "LTE" in the memory of smartphone 301. In this manner, smartphone 301 is updated to correct the syntax error detected by signaling error management system 330 without requiring a one-off solution or the push out of code specifically tailored for smartphone 301. Advantageously, by providing the URI link to the correction data for the syntax error instead of just an error notification, signaling error management system 330 enables smartphone 301 to access the correction data and fix the root cause of the detected syntax error, which helps reduce and potentially eliminate costly workarounds in the RAN and signaling layer.

Figure 5:
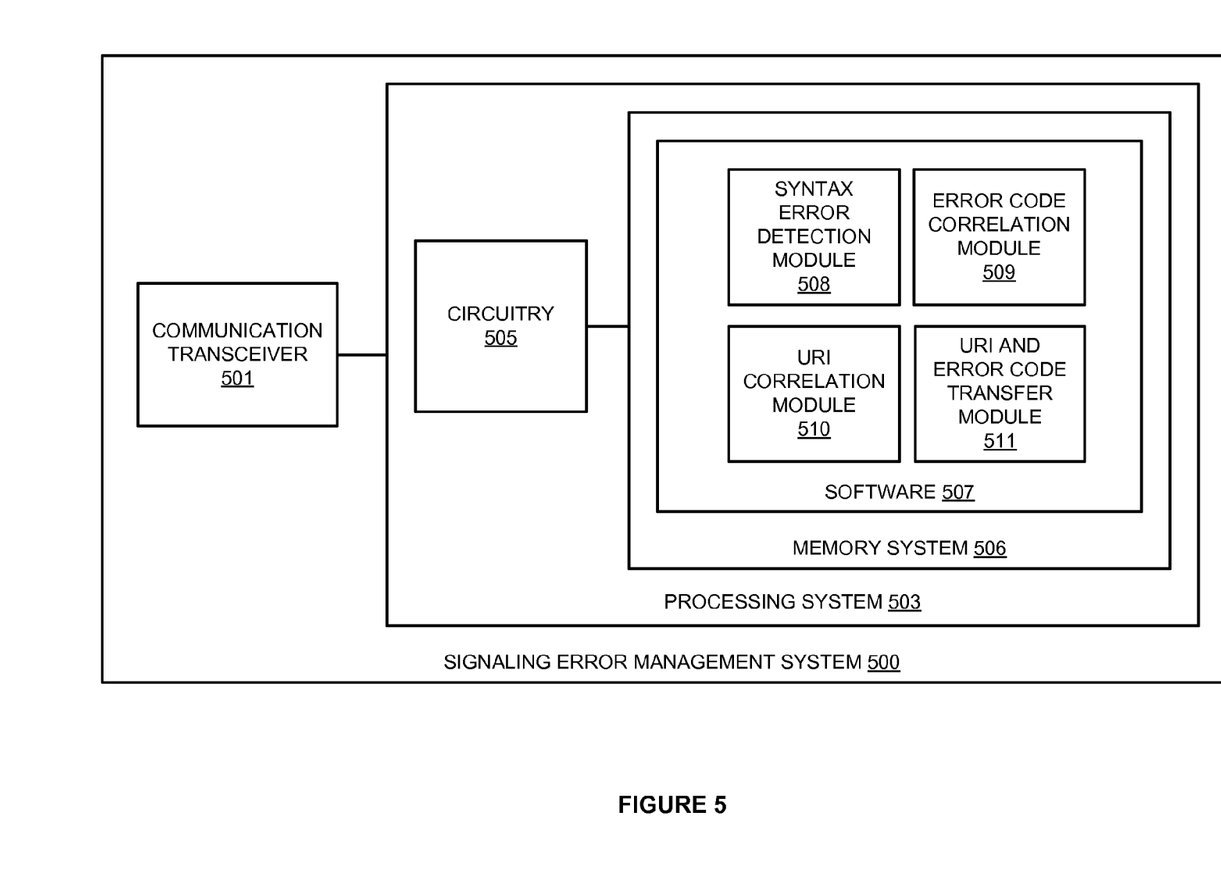
FIG. 5 is a block diagram that illustrates a syntax error management system.

FIG. 5 is a block diagram that illustrates signaling error management system 500. Signaling error management system 500 provides an example of signaling error management system 330, although system 330 may use alternative configurations. Signaling error management system 500 comprises communication transceiver 501 and processing system 503. Processing system 503 is linked to communication transceiver 501. Processing system 503 includes processing circuitry 505 and memory system 506 that stores operating software 507. Operating software 507 comprises software modules 508-511.

Communication transceiver 501 comprises components that communicate over communication links, such as network cards, ports, RF transceivers, processing circuitry and software, or some other communication components. Communication transceiver 501 may be configured to communicate over metallic, wireless, or optical links. Communication transceiver 501 may be configured to use TDM, IP, Ethernet, optical networking, wireless protocols, communication signaling, or some other communication format—including combinations thereof. Communication transceiver 501 could be configured to transfer an error code and a URI for delivery to a wireless communication device.

Processing circuitry 505 comprises microprocessor and other circuitry that retrieves and executes operating software 507 from memory system 506. Processing circuitry 505 may comprise a single device or could be distributed across multiple devices—including devices in different geographic areas. Processing circuitry 505 may be embedded in various types of equipment. Memory system 506 comprises a non-transitory computer readable storage medium, such as a disk drive, flash drive, data storage circuitry, or some other hardware memory apparatus. Memory system 506 may comprise a single device or could be distributed across multiple devices—including devices in different geographic areas. Memory system 506 may be embedded in various types of equipment. In some examples, a computer apparatus could comprise memory system 506 and operating software 507. Operating software 507 comprises computer programs, firmware, or some other form of machine-readable processing instructions. Operating software 507 may include an operating system, utilities, drivers, network interfaces, applications, or some other type of software. In this example, operating software 507 comprises software modules 508-511, although software 507 could have alternative configurations in other examples.

When executed by circuitry 505, operating software 507 directs processing system 503 to operate as described herein according to the operation of FIG. 2 and for signaling error management system 330. In particular, operating software 507 directs processing system 503 to process text of a signaling message to detect a syntax error. Additionally, operating software 507 directs processing system 503 to correlate the syntax error to an error code and to correlate the error code to a URI. Operating software 507 further directs processing system 503 to direct communication transceiver 501 to transfer the error code and the URI for delivery to the wireless communication device, wherein the wireless communication device uses the URI to retrieve correction data for the syntax error.

In this example, operating software 507 comprises a syntax error detection software module 508 that processes text of a signaling message to detect a syntax error. In addition, operating software 507 comprises an error code correlation software module 509 that correlates the syntax error to an error code. Further, operating software 507 comprises a URI correlation software module 510 that correlates the error code to a URI. Finally, operating software 507 comprises a URI and error code transfer software module 511 that transfers the error code and the URI for delivery to the wireless communication device, wherein the wireless communication device uses the URI to retrieve correction data for the syntax error.

The above description and associated figures teach the best mode of the invention. The following claims specify the scope of the invention. Note that some aspects of the best mode may not fall within the scope of the invention as specified by the claims. Those skilled in the art will appreciate that the features described above can be combined in various ways to form multiple variations of the invention. As a result, the invention is not limited to the specific embodiments described above, but only by the following claims and their equivalents.

What is claimed is:

1. A method of operating a wireless communication network to handle a syntax error in a signaling message received from a wireless communication device, the method comprising:
    responsive to receiving the signaling message transferred by the wireless communication device, processing text of the signaling message to detect the syntax error in the signaling message;
    correlating the syntax error to an error code by at least correlating the syntax error to a type of previously logged errors;
    correlating the error code to a uniform resource identifier (URI) that corresponds to correction data for the syntax error and is generated after a threshold number of occurrences of the type of the previously logged errors; and
    transferring the error code and the URI for delivery to the wireless communication device, wherein the wireless communication device uses the URI to retrieve the correction data for the syntax error.

2. The method of claim 1 wherein the correction data comprises information for a user of the wireless communication device.

3. The method of claim 1 wherein the correction data comprises program instructions that direct the wireless communication device to correct the syntax error.

4. The method of claim 1 wherein the correction data comprises program instructions that direct the wireless communication device to update a protocol associated with the syntax error.

5. The method of claim 1 wherein correlating the syntax error to the error code comprises searching a database correlating the syntax error to the type of previously logged errors.

6. The method of claim 1 wherein the signaling message comprises a session description protocol (SDP) message.

7. A signaling error management system to handle a syntax error in a signaling message received by a wireless communication network from a wireless communication device, the system comprising:
    responsive to receiving the signaling message, a processing system comprising circuitry configured to process text of the signaling message to detect the syntax error in the signaling message, correlate the syntax error to an error code by at least correlating the syntax error to a type of previously logged errors, and correlate the error code to a uniform resource identifier (URI) that corresponds to correction data for the syntax error and is generated after a threshold number of occurrences of the type of the previously logged errors; and
    a communication transceiver configured to transfer the error code and the URI for delivery to the wireless communication device, wherein the wireless communication device uses the URI to retrieve the correction data for the syntax error.

8. The system of claim 7 wherein the correction data comprises information for a user of the wireless communication device.

9. The system of claim 7 wherein the correction data comprises program instructions that direct the wireless communication device to correct the syntax error.

10. The system of claim 7 wherein the correction data comprises program instructions that direct the wireless communication device to update a protocol associated with the syntax error.

11. The system of claim 7 wherein the processing system configured to correlate the syntax error to the error code comprises the processing system configured to search a database that correlates the syntax error to the type of previously logged errors.

12. The system of claim 7 wherein the signaling message comprises a session description protocol (SDP) message.

13. A computer apparatus to handle a syntax error in a signaling message received by a wireless communication network from a wireless communication device, the apparatus comprising:
    at least one non-transitory computer-readable storage medium storing software instructions;
    the software instructions configured, when executed by a computer system, to direct the computer system to process text of the signaling message to detect the syntax error responsive to receiving the signaling message, correlate the syntax error to an error code by at least correlating the syntax error to a type of previously logged errors, correlate the error code to a uniform resource identifier (URI) that corresponds to correction data for the syntax error and is generated after a threshold number of occurrences of the type of the previously logged errors, and transfer the error code and the URI for delivery to the wireless communication device, wherein the wireless communication device uses the URI to retrieve the correction data for the syntax error.

14. The apparatus of claim 13 wherein the correction data comprises information for a user of the wireless communication device.

15. The apparatus of claim 13 wherein the correction data comprises program instructions that direct the wireless communication device to correct the syntax error.

16. The apparatus of claim 13 wherein the correction data comprises program instructions that direct the wireless communication device to update a protocol associated with the syntax error.

17. The apparatus of claim 13 wherein the software instructions configured to direct the computer system to correlate the syntax error to the error code comprises the software instructions configured to direct the computer system to search a database that correlates the syntax error to the type of previously logged errors.

* * * * *